US012289832B2

(12) United States Patent
Zhao

(10) Patent No.: US 12,289,832 B2
(45) Date of Patent: Apr. 29, 2025

(54) CIRCUIT BOARD

(71) Applicant: NANJING ZTE NEW SOFTWARE CO., LTD, Jiangsu (CN)

(72) Inventor: Li Zhao, Guangdong (CN)

(73) Assignee: NANJING ZTE NEW SOFTWARE CO., LTD., Jiangsu (CN)

(*) Notice: Subject to any disclaimer, the term of this patent is extended or adjusted under 35 U.S.C. 154(b) by 145 days.

(21) Appl. No.: 18/033,585

(22) PCT Filed: Nov. 3, 2021

(86) PCT No.: PCT/CN2021/128318
§ 371 (c)(1),
(2) Date: Apr. 25, 2023

(87) PCT Pub. No.: WO2022/095874
PCT Pub. Date: May 12, 2022

(65) Prior Publication Data
US 2023/0397334 A1 Dec. 7, 2023

(30) Foreign Application Priority Data
Nov. 3, 2020 (CN) .......................... 202011208923.8

(51) Int. Cl.
*H05K 1/11* (2006.01)

(52) U.S. Cl.
CPC ... *H05K 1/115* (2013.01); *H05K 2201/09509* (2013.01); *H05K 2201/09609* (2013.01)

(58) Field of Classification Search
CPC .... H05K 1/115; H05K 1/0245; H05K 1/0251; H05K 1/112; H05K 1/116;
(Continued)

(56) References Cited

U.S. PATENT DOCUMENTS 8,119,931 B1  2/2012 Liu
2004/0150970 A1  8/2004 Lee
(Continued)

FOREIGN PATENT DOCUMENTS

CN  101014224 A  8/2007
CN  104202905 A  12/2014
(Continued)

OTHER PUBLICATIONS

WIPO, International Search Report issued on Dec. 23, 2021.
(Continued)

*Primary Examiner* — Roshn K Varghese
(74) *Attorney, Agent, or Firm* — Li & Cai Intellectual Property (USA) Office

(57) ABSTRACT

There is provided a circuit board. The circuit board includes a signal hole array matched with a terminal array of a connector, and at least part of signal holes in the signal hole array are first signal holes (20); the first signal holes (20) are blind holes, are communicated with part of wiring layers of the circuit board, and are connected to auxiliary conductive structures (30) through auxiliary lines (03) located in auxiliary wiring layers; the auxiliary conductive structures (30) are at least communicated with the auxiliary wiring layers and a wiring layer not communicated with the first signal holes (20), and are connected to signal lead-out lines (04) located in a main wiring layer; and the signal lead-out lines (04) extend out of a region where the signal hole array is located.

8 Claims, 3 Drawing Sheets

(58) Field of Classification Search
CPC .......... H05K 2201/09509; H05K 2201/09609;
H05K 2201/09227; H05K 2201/09645;
H05K 2201/09254; H05K 2201/09627;
H05K 2201/09245; H05K 2201/09263;
H05K 2201/09272
See application file for complete search history.

(56) References Cited

U.S. PATENT DOCUMENTS

| | | | |
|---|---|---|---|
| 2006/0118332 A1 | 6/2006 | Benham | |
| 2006/0228912 A1 | 10/2006 | Morlion et al. | |
| 2007/0033457 A1* | 2/2007 | Park | H05K 3/403 |
| | | | 714/724 |
| 2009/0315158 A1* | 12/2009 | Maetani | H05K 1/0245 |
| | | | 257/664 |
| 2015/0114706 A1 | 4/2015 | Rose et al. | |
| 2016/0150645 A1* | 5/2016 | Gailus | H05K 1/0219 |
| | | | 174/262 |
| 2021/0321510 A1* | 10/2021 | Farkas | H01L 23/64 |

FOREIGN PATENT DOCUMENTS

| | | |
|---|---|---|
| CN | 105873362 A | 8/2016 |
| CN | 106231788 A | 12/2016 |
| CN | 205883702 U | 1/2017 |
| JP | H08195539 A | 7/1996 |

OTHER PUBLICATIONS

European Patent Office, the extended European Search Report dated Jul. 25, 2024, for corresponding EP application No. 21888571.3.
Japan Patent Office, the second Office action dated Oct. 22, 2024, for corresponding JP application No. 2023-525595.

* cited by examiner

CIRCUIT BOARD

CROSS-REFERENCE TO RELATED APPLICATIONS

The present disclosure claims the priority to Chinese Patent Application No. 202011208923.8 filed on Nov. 3, 2020, the contents of which are incorporated herein by reference in their entirety.

TECHNICAL FIELD

The present disclosure relates to the field of circuit technology, and in particular, to a circuit board.

BACKGROUND

A connector is a basic core element essential for an electrical connection of a circuit system, and is widely applied to products in the fields of industry, automobiles, and communications. With the development of technologies, especially the 5G technology, the connector is developing toward high speed, high frequency, and high density. With the development of the connector, more and more signals are desired to be introduced to an internal circuit of the connector.

Since the connector cannot adopt a High Density Interconnect (HDI) process, for ensuring that the signals from the connector can be introduced to an internal circuit of a circuit board, the number of wiring layers of the circuit board connected to the connector is desired to be increased, but a cost of the circuit board becomes higher as the number of the wiring layers being increased.

SUMMARY

The present disclosure provides a circuit board, including a signal hole array matched with a terminal array of a connector, and at least part of signal holes in the signal hole array are first signal holes; the first signal holes are blind holes, are communicated with part of wiring layers of the circuit board, and are connected to auxiliary conductive structures through auxiliary lines located in auxiliary wiring layers;
the auxiliary conductive structures are at least communicated with the auxiliary wiring layers and a wiring layer not communicated with the first signal holes, and are connected to signal lead-out lines located in a main wiring layer; and the signal lead-out lines extend out of a region where the signal hole array is located.

DETAIL DESCRIPTION OF EMBODIMENTS

Figure 1:
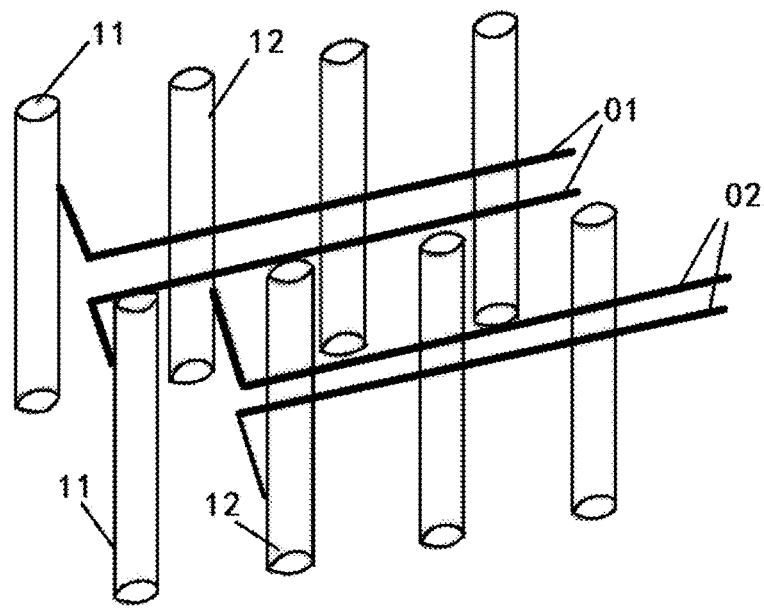
FIG. 1 is a schematic diagram showing a layout of signal lead-out lines in the existing technology.

In order to enable those of ordinary skill in the art to better understand the technical solution of the present disclosure, a circuit board provided by the present disclosure is described in detail below with reference to the drawings.

An embodiment of the present disclosure will be described more fully below with reference to the drawings, but the embodiment illustrated herein may be embodied in different forms, and should not be interpreted as being limited to the embodiment described herein. Rather, the embodiment is provided to make the present disclosure more thorough and complete, and is intended to enable those of ordinary skill in the art to fully understand the scope of the present disclosure.

The drawings of the present disclosure are intended to provide a further understanding of the embodiment of the present disclosure and constitute a part of the specification. Together with the embodiment of the present disclosure, the drawings are used to explain the present disclosure, but do not constitute any limitation to the present disclosure. The above and other features and advantages will become more apparent to those of ordinary skill in the art from the description of the specific exemplary embodiment with reference to the drawings.

The embodiment of the present disclosure is described with reference to plans and/or cross-sectional views with the aid of idealized schematic diagrams of the present disclosure. Accordingly, the exemplary drawings may be modified according to manufacturing techniques and/or tolerances.

The embodiment described herein and the features therein may be arbitrarily combined with one another if no conflict is incurred.

The terms used herein are merely used to describe the specific embodiment, and are not intended to limit the present disclosure. The term "and/or" used herein includes any or all combinations of one or more associated listed items. As used herein, the terms "a" and "the" which indicate a singular form are intended to include a plural form, unless expressly stated in the context. The terms "comprise/include" and "be made of/consist of" used herein indicate the presence of the described features, integers, operations, elements and/or components, but do not exclude the presence or addition of one or more other features, integers, operations, elements, components and/or combinations thereof.

Unless otherwise defined, all terms (including technical terms and scientific terms) used herein have the same meaning as commonly understood by those of ordinary skill in the art. It should be further understood that terms, such as those defined in commonly used dictionaries, should be interpreted as having a meaning that is consistent with a meaning in the context of the existing technology and the background of the present disclosure, and should not be interpreted in an idealized or overly formal sense unless expressly so defined herein.

Embodiments of the present disclosure are not limited to that illustrated by the drawings, but include modifications to configuration formed based on a manufacturing process. Thus, regions shown in the drawings are illustrative, and shapes of the regions shown in the drawings illustrate specific shapes of regions of elements, but are not intended to make limitations.

In some existing techniques, pins of a connector may also be called signal pins (terminals), a circuit board is provided with signal holes corresponding to the signal pins of the connector, the signal pins can be inserted into the corresponding signal holes of the circuit board, and the signal holes of the circuit board corresponding to the signal pins are connected to an internal circuit of the circuit board (i.e., a circuit in the circuit board for processing signals from the signal pins of the connector) through signal lead-out lines, that is, the signal pins can be connected to the internal circuit of the circuit board through the corresponding signal holes of the circuit board and the signal lead-out lines of the signal holes to introduce the signals to the internal circuit of the circuit board.

With the development of the connector, more and more signals are desired to be introduced to the internal circuit of the circuit board through the signal pins, resulting in an increase of the signal pins of the connector. Therefore, the signal holes of the circuit board corresponding to the signal pins become more and more, and a space between the signal holes becomes less and less, that is, a space for an arrangement of the signal lead-out lines becomes less and less. In view of this, the number of wiring layers of the circuit board can be increased to allow the signal lead-out lines of different signal holes to be arranged in different wiring layers of the circuit board, so as to "increase" the space for the arrangement of the signal lead-out lines, thereby ensuring that all the signals can be introduced to the internal circuit of the circuit board.

Figure 2:
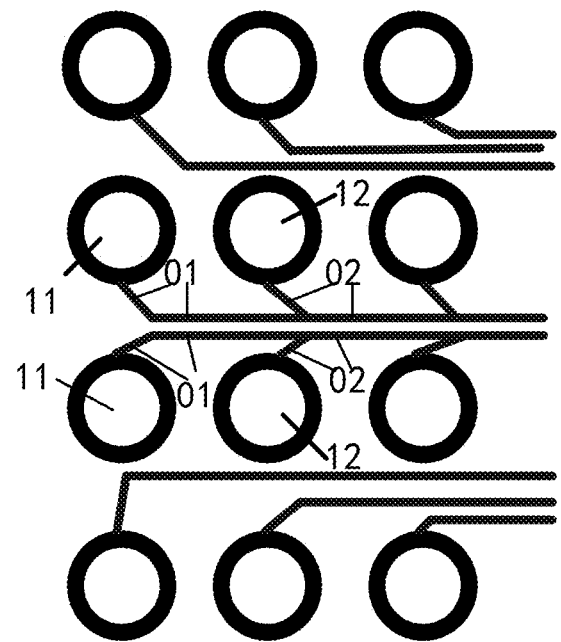
FIG. 2 is a schematic structural diagram of a circuit board in the existing technology.

With reference to FIG. 1 (which merely shows spatial positions of signal holes and signal lead-out lines) and FIG. 2 (which merely shows projection relationships between the signal holes and the signal lead-out lines), the signal holes 11 and the signal holes 12 in FIG. 1 and FIG. 2 are all signal holes corresponding to the signal pins of the connector, two signal holes 11 are a pair of differential signal holes (that is, the signals introduced by the signal pins corresponding to the two signal holes are a pair of differential signals), two signal holes 12 are another pair of differential signal holes, the signal lead-out lines 01 are the signal lead-out lines of the signal holes 11, the signal lead-out lines 02 are the signal lead-out lines of the signal holes 12, and the signal lead-out lines 01 and the signal lead-out lines 02 have a same outgoing direction.

Furthermore, in response to that the signal holes are the differential signal holes, the signal lead-out lines corresponding to each pair of differential signal holes are desired be arranged in a same wiring layer of the circuit board. In a case where at most three signal lead-out lines can be arranged between any two signal holes, for example, a pitch between the two signal holes is about 1.46 mm (millimeter), since each pair of signal lead-out lines are desired to be arranged in the same wiring layer of the circuit board, in practical applications, two signal lead-out lines actually can be arranged between any two rows of the signal holes in each wiring layer.

Therefore, if an airgap between any two rows of differential signal holes in a same wiring layer is insufficient for an arrangement of four signal lead-out lines, it is apparent that the two signal lead-out lines 01 corresponding to the two signal holes 11 and the two signal lead-out lines 02 corresponding to the two signal holes 12 cannot be arranged in the same wiring layer, and would be arranged in different wiring layers of the circuit board.

However, the increase in the number of the wiring layers of the circuit board not only leads to an increase in the cost of the circuit board, but also leads to an increase in a thickness of the circuit board, which further affects welding of the circuit board and reduces welding reliability of the circuit board.

In other existing techniques, the number of the signal lead-out lines is reduced by optimizing a signal fan-out mode and directions of the signal lead-out lines, and the number of the wiring layers of the circuit board is reduced by arranging more signal lead-out lines in a same layer of the circuit board. However, limited by signal integrity, most of the signal lead-out lines cannot be deleted or be easily changed in direction through the optimization, so that an effect of reducing the number of the wiring layer of the circuit board in those existing techniques is not obvious.

Figure 3:
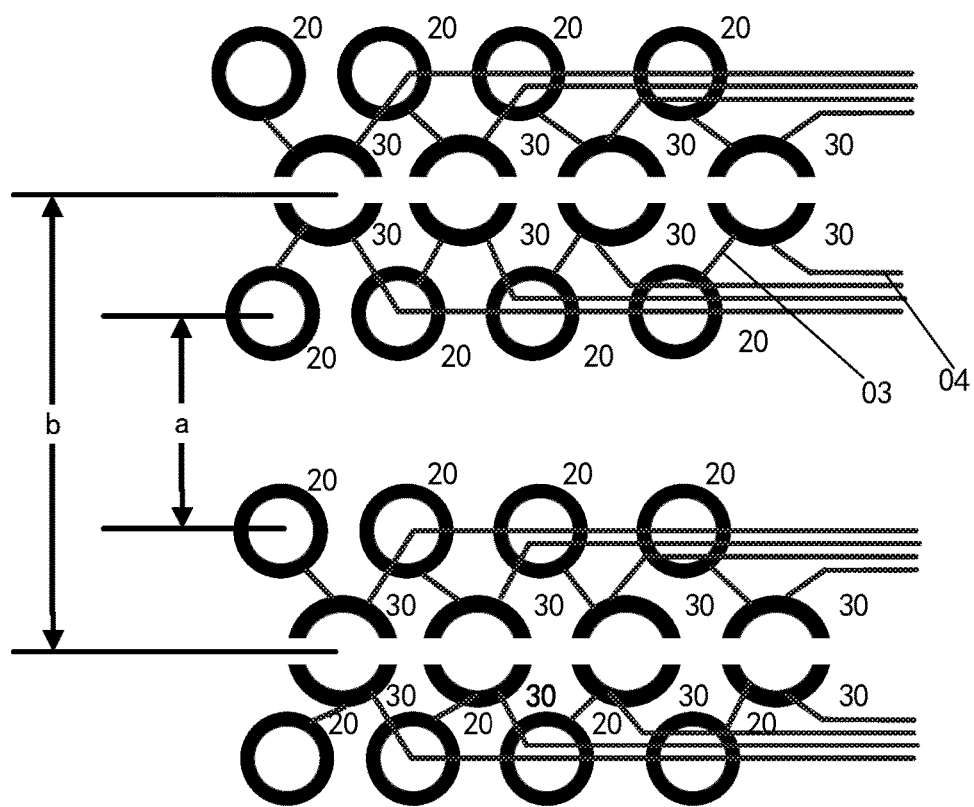
FIG. 3 is a schematic structural diagram of a circuit board according to the present disclosure.

With reference to FIG. 3, an embodiment of the present disclosure provides a circuit board, which specifically includes a signal hole array matched with a terminal array of a connector, at least part of signal holes in the signal hole array are first signal holes 20, the first signal holes 20 are blind holes, are communicated with part of wiring layers of the circuit board, and are connected to corresponding auxiliary conductive structures 30 through auxiliary lines 03 located in auxiliary wiring layers, the auxiliary conductive structures 30 are at least communicated with the auxiliary wiring layers and a main wiring layer not communicated with the first signal holes 20, and are connected to signal lead-out lines 04 located in the main wiring layer, and the signal lead-out lines 04 extend out of a region where the signal hole array is located.

The terminal array of the connector is an array formed by a plurality of signal pins of the connector, an array formed by signal holes of the circuit board, corresponding to the signal pins forming the terminal array, is the signal hole array of the circuit board, and the signal hole corresponding to each signal pin in the terminal array is the signal hole at a position corresponding to that of the signal pin and allowing an insertion of the signal pin during the connector is connected to the circuit board.

With reference to FIG. 3 (which merely shows projection relationships between the first signal holes 20, the auxiliary conductive structures 30, the auxiliary lines 03, and the signal lead-out lines 04), at least part of the signal holes that form the signal hole array are the first signal holes 20, the first signal holes 20 are specifically blind holes, and are communicated with part of the wiring layers of the circuit board, and each first signal hole 20 is connected to the auxiliary conductive structure 30 through the auxiliary line 03 (for clarity, merely one auxiliary line 03 is marked in FIG. 3, but all lines that connect the first signal holes 20 to the auxiliary conductive structures 30 are the auxiliary lines 03) located in one (i.e., the auxiliary wiring layer) of the wiring layers communicated with the first signal hole 20.

Different first signal holes 20 are connected to different auxiliary conductive structures 30, and may be communicated with different wiring layers of the circuit board, so that the auxiliary wiring layers corresponding to different first signal holes 20 may also be different, that is, the first signal holes 20, the auxiliary lines 03, and the auxiliary conductive structures 30 have corresponding relationships, e.g., correspond to each other one to one.

The auxiliary conductive structure 30 corresponding to each first signal hole 20 is at least communicated with the auxiliary wiring layer communicated with the first signal hole 20 and a wiring layer not communicated with the first signal hole 20, and is connected to the signal lead-out line 04 located in the main wiring layer not communicated with the first signal hole 20 (for clarity, merely one signal lead-out line 04 is marked in FIG. 3, but all lines that are connected to the auxiliary conductive structures 30 and extend outward in FIG. 3 are the signal lead-out lines 04), and the auxiliary conductive structure 30 is connected to an internal circuit for processing signals, inside the circuit board located beyond the region where the signal hole array is located, through the signal lead-out line.

In addition to including the first signal holes 20, the signal hole array of the circuit board provided by the embodiment of the present disclosure may further include a second signal hole, the second signal hole may specifically be a through hole (as the signal hole 11 or the signal hole 12 in FIG. 2), and the second signal hole is directly connected to the internal circuit of the circuit board by being connected to a signal lead-out line. Specifically, the signal lead-out line of the second signal hole may be arranged in the main wiring layer together with the signal lead-out lines 04 corresponding to the first signal holes 20.

Figure 4:
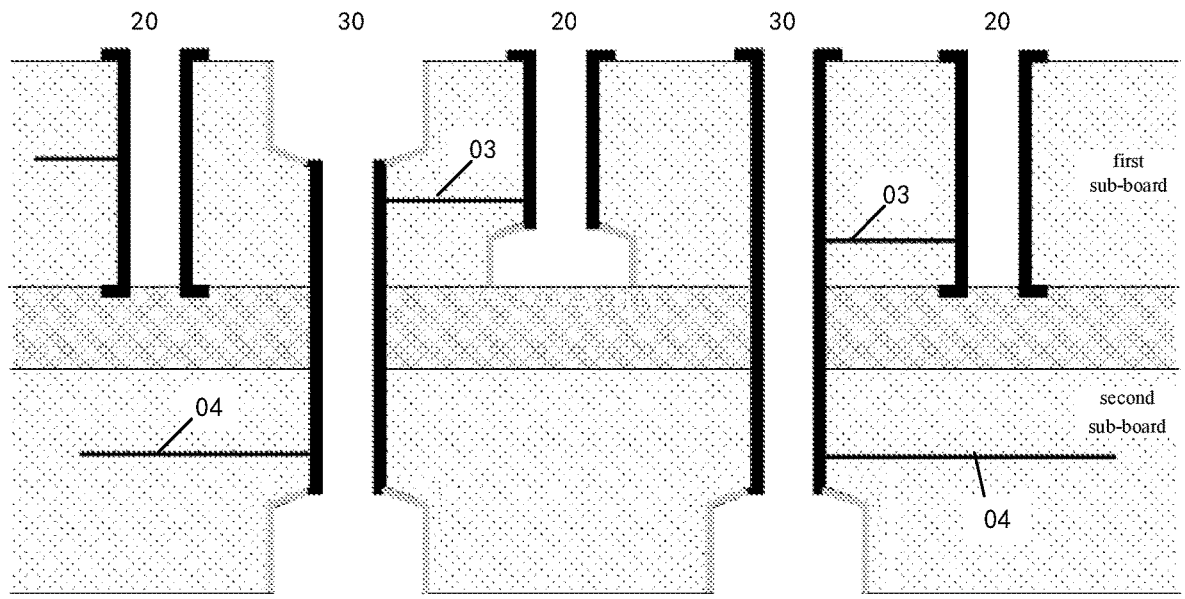
FIG. 4 is a schematic diagram showing a sectional structure of a circuit board according to the present disclosure.

Specifically, with reference to FIG. 4, the through hole, the first signal holes, and the auxiliary conductive structures of the circuit board provided by the embodiment of the present disclosure may be combined with big-small hole design and a back drilling process in the existing technology. For example, part of the first signal holes 20 and all the auxiliary conductive structures 30 in FIG. 4 are formed by the back drilling process, and conduct electricity merely in part of the layers, for example, each of the auxiliary conductive structures 30 may conduct electricity merely in a portion corresponding to the layers between the auxiliary wiring layer and the wiring layer (i.e., the main wiring layer) where the signal lead-out lines 04 are located, so as to avoid shunting and circulating, i.e., the stub effect (residual effect), caused by too many conductive portions, thereby improving integrity of the signals.

A process of introducing signals from the signal pins of the connector to the internal circuit of the circuit board through the circuit board provided by the embodiment of the present disclosure may specifically include that: in response to that the signal pins of the connector corresponding to the first signal holes 20 are inserted into the first signal holes 20, the signals from the signal pins are introduced to the first signal holes 20, then introduced to the auxiliary conductive structures 30 corresponding to the first signal holes 20 through the auxiliary lines 03, and then introduced to the internal circuit of the circuit board through the signal lead-out lines 04 connected to the auxiliary conductive structures 30.

Since the first signal holes 20 are the blind holes, the first signal holes 20 are not communicated with the wiring layer where the signal lead-out lines 04 connected to the auxiliary conductive structures 30 are located, that is, the signals from the first signal holes 20 are introduced, through the auxiliary conductive structures 30, to the main wiring layer not communicated with the first signal holes 20. Therefore, the signal lead-out lines 04 connected to the auxiliary conductive structures 30 may be arranged at positions where orthographic projections of the first signal holes 20 corresponding to the signal lead-out lines 04 are located. In this way, during the signal lead-out lines 04 being arranged, there is no need to considering to keep a safe distance from the first signal holes, and merely a safe distance between the signal lead-out lines 04 is to be considered, resulting in an increase in layout space of the signal lead-out lines 04. Under a condition that a size of the wiring layer in the present disclosure is kept the same as that in the existing technology, the wiring layer, where the signal lead-out lines 04 connected to the auxiliary conductive structures 30 are located, in the circuit board provided by the embodiment of the present disclosure, allows for an arrangement of more signal lead-out lines 04, so that the number of the wiring layers of the circuit board can be reduced, and, the thickness of the circuit board can be reduced due to the reduction of the number of the wiring layers, which can improve welding reliability of a large-sized Ball Grid Array (BGA).

The connector corresponding to the circuit board provided by the embodiment of the present disclosure may be any device that is to be connected to the circuit board through the signal holes, such as an output/connector of any other equipment. Specifically, the circuit board provided by the embodiment of the present disclosure may be a Printed Circuit Board (PCB), and may specifically be a base station communication circuit board.

In general, a design of the PCB includes carrying out an automatic layout with a drawing software according to a principle diagram and a certain design rule, and then carrying out a manual adjustment to finally complete the design. Limited by PCB processing capability and PCB assembly capability, the finally designed PCB is desired not only to perform functions, but also to meet requirements of productibility, reliability, and low cost.

With the development of the technologies, the PCB is developing toward high speed, high frequency, high density, and multiple functions, and the design of the PCB as an important part of the PCB process are also developing toward high speed, high frequency, high density, and multiple functions.

In a general PCB design, a design of lead-out lines of the BGA is a focus of optimization, and first-order laser holes, second-order/third-order laser holes and the like are adopted in some existing techniques to make full use of space of the lead-out lines of the BGA, thereby increasing density of the lead-out lines of the BGA.

However, in some circuit boards, especially the base station communication circuit board, the BGA has a sufficient space for the lead-out lines and a sufficient device layout space, but due to the fact that the connector cannot adopt the HDI process, merely the way of increasing the number of wiring layers of the circuit board can be adopted for increasing a layout space of signal lead-out lines of signal holes corresponding to signal pins of the connector, which increases the cost.

As for the circuit board provided by the embodiment of the present disclosure, by designing the first signal holes 2 as the blind holes and designing the corresponding auxiliary conductive structures 30 for the first signal holes 20, the signals from the first signal holes 20 are introduced to the wiring layer not communicated with the first signal holes 20, the layout space of the signal lead-out lines is increased, the number of the wiring layers of the circuit board is reduced, and the cost of the base station communication circuit board can be significantly reduced.

Specifically, the connector corresponding to the circuit board provided by the embodiment of the present disclosure may be a high-speed connector. That is, any circuit board connected to the high-speed connector may specifically be the circuit board provided by the embodiment of the present disclosure.

Due to a high intensity of pins (also called signal pins) of the high-speed connector, the high-speed connector is more likely faced with a condition that there is no desired layout space for the signal lead-out lines of the signal holes and the layout space is to be "increased" by increasing the number of the wiring layers of the circuit board. Moreover, lengths of the pins (also called the signal pins) of the high-speed connector are generally reduced, so that depths of the signal holes of the circuit board corresponding to the pins are also reduced, which further reduces the layout space of the signal lead-out lines of the signal holes. If the circuit board connected to the high-speed connector is the circuit board provided by the embodiment of the present disclosure, the number of the wiring layers of the circuit board can be significantly reduced, and the cost of the circuit board can be reduced.

With reference to FIG. 3, in some implementations, on a plane parallel to the circuit board, orthographic projections of at least part of the signal lead-out lines 04 overlap orthographic projections of the first signal holes 20.

The signal lead-out lines 04 connected to the auxiliary conductive structures 30 in the circuit board provided by the embodiment of the present disclosure, may pass through positions of the wiring layer corresponding to the orthographic projections of the first signal holes 20 corresponding to the signal lead-out lines 04; and since the first signal holes 20 are not communicated with the wiring layer where the signal lead-out lines 04 are located, even if the signal lead-out lines 04 are arranged at the positions of the wiring layer corresponding to the orthographic projections of the first signal holes 20, the signal lead-out lines 04 are not connected to the first signal holes 20 to affect a normal operation of the circuit board.

Compared with the signal lead-out lines 04 being arranged in the wiring layer communicated with the first signal holes 20 (the signal lead-out lines 04 cannot be arranged at positions corresponding to the first signal holes 20, and a safe distance must be kept between the signal lead-out lines 04 and the first signal holes 20), the signal lead-out lines 04 according to the embodiment of the present disclosure apparently can be arranged in a larger layout space.

The signal hole array of the circuit board may include a plurality of first signal holes 20, and different first signal holes 20 may be communicated with different wiring layers. Therefore, in the wiring layer where the signal lead-out lines 04 connected to the auxiliary conductive structures 30 are located, other first signal holes 20 or through holes communicated with the wiring layer may be arranged at other positions of the wiring layer other than the positions corresponding to the orthographic projections of the first signal holes 20 corresponding to the signal lead-out lines 04, and for arranging the signal lead-out lines 04 connected to the auxiliary conductive structures 30 at the other positions, whether the signal lead-out lines 04 may be communicated with the other first signal holes 20 or through holes and leaving a safe distance between the signal lead-out lines 04 and the other first signal holes 20 or through holes are desired to be considered, which increases difficulty in arranging the signal lead-out lines 04 connected to the auxiliary conductive structures 30.

Furthermore, the signal lead-out lines 04 connected to the auxiliary conductive structures 30 is to lead the signals introduced to the first signal holes 20 out of the region where the signal hole array is located, and arranging the signal lead-out lines 04 connected to the auxiliary conductive structures 30 at the positions corresponding to the orthographic projections of the first signal holes 20 can avoid a disordered arrangement of the signal lead-out lines 04 caused by intersections of the signal lead-out lines 04 corresponding to different first signal holes 20, thereby making the arrangement of the signal lead-out lines 04 more reasonable.

With reference to FIG. 3, in some implementations, the first signal holes 20 are arranged in a plurality of rows parallel to a first direction, and each row includes multiple first signal holes 20; the first signal holes 20 are divided into a plurality of groups, each group includes two adjacent rows of first signal holes 20; the auxiliary conductive structures 30 corresponding to each row of first signal holes 20 are located, along a direction perpendicular to the first direction, on a side of the row of first signal holes 20 away from the other row of the first signal holes 20 that forms one group together with the row of the first signal holes 20; and each signal lead-out line 04 includes a first portion extending into the group in which the first signal hole 20 corresponding to the signal lead-out line 04 is located, and a second portion along the first direction.

With reference to FIG. 3, the first signal holes 20 in the signal hole array are arranged in a plurality of rows parallel to a certain direction (i.e., the first direction, e.g., a lateral direction in FIG. 3), each row (e.g., the first signal holes 20 in the lateral direction in FIG. 3 are arranged in one row) includes at least one first signal hole 20, and every two rows of first signal holes 20 form one group (e.g., the two rows in the middle of FIG. 3 along a longitudinal direction form one group).

The auxiliary conductive structures 30 corresponding to each group of first signal holes 20 are located on "outer sides" of the group of first signal holes 20 along the direction perpendicular to the first direction. Specifically, the auxiliary conductive structure 30 corresponding to each first signal hole 20 is located on the "outer side" closer to the first signal hole 20 itself, and the corresponding signal lead-out line 04 connected to the auxiliary conductive structure 30 includes two portions, that is, the first portion extends into the group (that is, extending toward an "inner side" opposite to the "outer side") and the second portion which is parallel to the first direction and is configured to lead the signals out of the region where the signal hole array is located.

Specifically, with reference to FIG. 3, the first signal holes 20 are arranged in a plurality of rows along a horizontal direction, the two rows of first signal holes 20 in the middle (the second row and the third row) form one group of first signal holes 20, the auxiliary conductive structure 30 corresponding to each first signal hole 20 in the group is located, in the direction perpendicular to the horizontal direction, on an "outer side" of the group closer to the first signal hole 20 itself, the auxiliary conductive structures 30 corresponding to the second row of first signal holes 20 are located between the first row of first signal holes 20 and the second row of first signal holes 20, the auxiliary conductive structures 30 corresponding to the third row of the first signal holes 20 are located between the third row of first signal holes 20 and the fourth row of first signal holes 20, and the signal lead-out lines 04 connected to the auxiliary conductive structures 30 include first portions extending from the auxiliary conductive structures 30 into the group (that is, extending toward a space between the second row of e first signal holes 20 and the third row of first signal holes 20) and the second portions extending outward along the horizontal direction (extending out of the region where the signal hole array is located).

In some implementations, at least part of the first signal holes 20 are differential signal holes.

Each group of first signal holes 20 include a plurality of pairs of first signal holes 20. For example, as shown in FIG. 3, for the first signal holes 20 in the second row and the third row, the first signal holes 20 in each column form a pair of differential signal holes.

A differential signal is a signal commonly used in many fields, and is also a signal which is often to be introduced to the internal circuit of the circuit board through the signal pins of the connector. Since differential signals are in pairs, the signal lead-out lines corresponding to each pair of differential signals are desired to be arranged as a pair in a same wiring layer, with the result that, in a space of the wiring layer allowing for an arrangement of three signal lead-out lines, merely two signal lead-out lines can actually be arranged in the space. Thus, the arrangement of the signal lead-out lines for introducing the differential signals to the internal circuit of the circuit board is more complicated.

In some implementations, the circuit board includes a first sub-board and a second sub-board; and the first signal holes 20 are communicated with all wiring layers of the first sub-board, and the auxiliary conductive structures 30 are at least communicated with the auxiliary wiring layers and the main wiring layer of the second sub-board.

The circuit board provided by the embodiment of the present disclosure may be implemented by a secondary pressing process, that is, two sub-boards are pressed together to form the circuit board, and each sub-board is a part of the circuit board. For example, assuming that a thickness of the circuit board is about 3.6 mm, the two sub-boards each having a thickness of about 1.8 mm may be pressed together to form the circuit board by the secondary pressing process.

The first signal holes 20 are connected to all the wiring layers of the first sub-board, that is, the first signal holes 20 are through holes for the first sub-board. Thus, each of the first signal holes 20 may be implemented by forming through holes in one sub-board (i.e., the first sub-board) and a portion of the other sub-board (i.e., the second sub-board) corresponding to the through holes (of the first sub-board) is not to be processed.

Since a process for implementing the through holes is simpler than that for implementing the blind holes, by implementing the first signal holes 20 in the above way, a process of manufacturing the first signal holes 20 is simplified. If the secondary pressing process is not adopted, the first signal holes 20 may also be obtained by a technology for machining of a deep blind hole.

In some implementations, all the signal holes in the signal hole array are the first signal holes 20.

With reference to FIG. 3, all the signal holes in the signal hole array are the first signal holes 20, that is, all the signal holes in the signal hole array are the blind holes, and are communicated with part of the wiring layers of the circuit board, and each first signal hole 20 is connected to the auxiliary conductive structure 30 through the auxiliary line 03 located in one (i.e., the auxiliary wiring layer) of the wiring layers communicated with the first signal hole 20.

In the circuit board provided by the embodiment of the present disclosure, under a condition that the number of the signal lead-out lines 04 is kept unchanged, the number of the wiring layers for the signal lead-out lines 04 corresponding to the first signal holes 20 is apparently less than the number of the wiring layers for the signal lead-out lines 04 corresponding to the through holes. In a case where all the signal holes in the signal hole array are the first signal holes 20, the number of the wiring layers of the circuit board can be reduced to the greatest extent, and the cost of the circuit board can be reduced.

In some implementations, the auxiliary conductive structures 30 are holes.

In some implementations, the auxiliary conductive structures are through holes.

Specifically, the auxiliary conductive structures may be the holes such as circular holes, elliptical holes, or long slot holes.

Holes are commonly used in the circuit board, and have mature manufacturing processes. The auxiliary conductive structures 30 being the holes can not only achieve the function to lead signals out of the region where the signal hole array is located, but also facilitate to be manufactured.

The auxiliary conductive structures being the through holes not only facilitates a connection between the first signal holes 20 and the auxiliary conductive structures 30, but also increases the number of the wiring layers available for the signal lead-out lines. Moreover, compared with a process of manufacturing the blind holes, a process of manufacturing the through holes is simpler.

In some implementations, the auxiliary conductive structures 30 are formed in a following way: dividing a metalized through hole into a plurality of electrically independent portions, and each portion serves as one auxiliary conductive structure 30.

In some implementations, the dividing a metalized through hole into a plurality of electrically independent portions includes: removing part of a wall of the metalized through hole, so as to divide the metalized through hole into the plurality of electrically independent portions.

Figure 6:
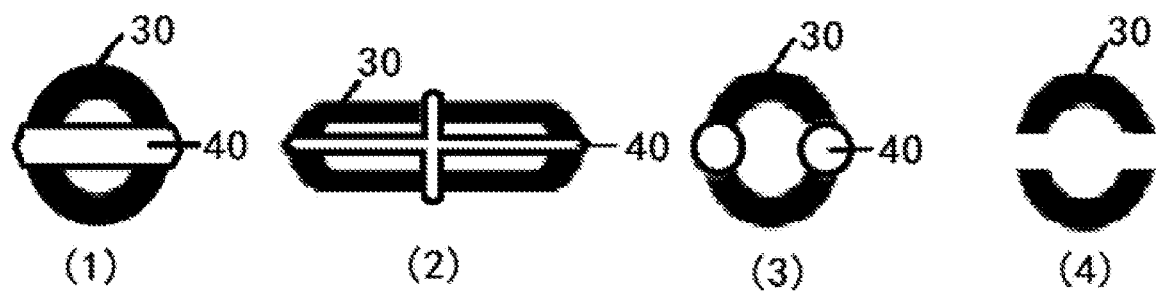
FIG. 6 is a schematic diagram illustrating a process of manufacturing auxiliary conductive structures of a circuit board according to the present disclosure.

The auxiliary conductive structures 30 may be obtained by dividing the metalized through hole, as shown in FIG. 3, each of the auxiliary conductive structure 30 corresponding to each of the first signal holes 20 in the first row and the auxiliary conductive structure 30 corresponding each of the first signal holes 20 in the second row is obtained by dividing one metalized through hole into two electrically independent portions; and similarly, each of the auxiliary conductive structure 30 corresponding to each of the first signal holes 20 in the third row and the auxiliary conductive structure 30 corresponding to each of the first signal holes 20 in the fourth row is obtained by dividing one metallized through hole into two electrically independent portions The division of the metalized through hole may be performed by adopting an existing technique. For example, with reference to (1) and (2) of FIG. 6, one or more non-metalized slot holes 40 are drilled in the metalized through hole; or with reference to (3) of FIG. 6, two non-metalized holes 40 are drilled in the metalized through hole; or with reference to (4) of FIG. 6, part of the wall of the metalized through hole is directly removed by means of etching.

By dividing one metallized through hole into multiple electrically independent portions, multi-role of the hole is realized, or the hole is shared, and the number of the auxiliary conductive structures 30 is also reduced, so that the layout space for the signal lead-out lines is further increased.

Figure 5:
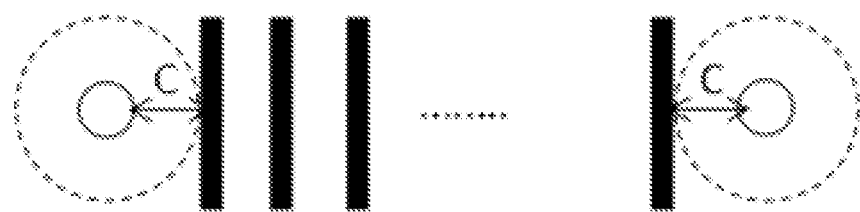
FIG. 5 is a schematic diagram illustrating a hole-line distance relationship of a circuit board according to the present disclosure.

Specifically, with reference to FIG. 3 and FIG. 5, a safe distance between the lines and the holes of the circuit board is C, a value of C is related to the number of the layers and the thickness of the circuit board, and C is generally about 0.228 mm, i.e., 9 mil (microinch). A safe distance between the lines may be about 0.102 mm, i.e., 4 mil, and a width of each of the lines may be about 0.102 mm, i.e., 4 mil. Assuming that the first signal holes 20 are the differential signal holes each having an aperture of about 0.34 mm, an aperture of each corresponding drilled hole is about 0.40 mm, and a distance between centers of each pair of the first signal holes 20 (e.g., the first signal holes 20 in the second row and the first signal holes 20 in the third row in FIG. 3) is about 1.46 mm. The auxiliary conductive structures 30 (e.g., the auxiliary conductive structures 30 in FIG. 3) are obtained by dividing metalized through holes, an aperture of each of the metalized through holes is about 0.55 mm, an aperture of each corresponding drilled hole is about 0.6 mm, each of the metalized through holes is divided into two electrically independent portions, and a width of each non-metalized slot hole of the obtained auxiliary conductive structures 30 is about 0.3 mm.

With reference to FIG. 3, according to a conventional design, a region in which the signal lead-out lines are allowed to be arranged is marked by a, and a length of the region a is about 1.46 mm−(0.4 mm+0.4 mm)/2, i.e., about 1.06 mm, and three signal lead-out lines (a length covered by the three signal lead-out lines is about 0.228 mm*2+0.102 mm*5, i.e., about 0.966 mm, and the remaining 0.094 mm is not enough to arrange another one signal lead-out line) are allowed to be arranged in the region a. Since the signal lead-out lines of each pair of differential signal holes are desired to be arranged in a same wiring layer, merely two signal lead-out lines can be arranged in each wiring layer.

However, in the circuit board provided by the embodiment of the present disclosure, a region of the wiring layer of the second sub-board available for the arrangement of the signal lead-out lines is marked by b, and a length of the region b is about 1.46 mm×2-0.6 mm/2-0.6 mm/2 i.e., about 2.32 mm. With reference to the above calculation, ten signal lead-out lines, i.e., the signal lead-out lines of five pairs of differential signal holes, are allowed to be arranged in the region b.

The present disclosure discloses the exemplary embodiment using specific terms, but the terms are merely used and should be merely interpreted as having general illustrative meanings, rather than for the purpose of limitation. Unless expressly stated, it is apparent to those of ordinary skill in the art that features, characteristics and/or elements described in connection with a particular embodiment can be used alone or in combination with features, characteristics and/or elements described in connection with other embodiments. Therefore, it should be understood by those of ordinary skill in the art that various changes in the forms and the details may be made without departing from the scope of the present disclosure defined by the appended claims.

What is claimed is:

1. A circuit board, comprising a signal hole array matched with a terminal array of a connector, with at least part of signal holes in the signal hole array being first signal holes, wherein the first signal holes are blind holes, are communicated with part of wiring layers of the circuit board, and are connected to corresponding auxiliary conductive structures through auxiliary lines located in auxiliary wiring layers;

the auxiliary conductive structures are at least communicated with the auxiliary wiring layers and a main wiring layer not communicated with the first signal holes, and are connected to signal lead-out lines located in the main wiring layer; and the signal lead-out lines extend out of a region where the signal hole array is located, wherein, on a plane parallel to the circuit board, orthographic projections of at least part of the signal lead-out lines overlap orthographic projections of the first signal holes, wherein the first signal holes are arranged in a plurality of rows parallel to a first direction, and each row comprises multiple first signal holes; the first signal holes are divided into a plurality of groups, and each group comprises two adjacent rows of first signal holes;

the auxiliary conductive structures corresponding to each row of first signal holes are located, along a direction perpendicular to the first direction, on a side of the row of first signal holes away from the other row of first signal holes that forms one group together with the row of the first signal holes; and each of the signal lead-out lines comprises a first portion extending into the group in which a first signal hole corresponding to the signal lead-out line is located, and a second portion along the first direction.

2. The circuit board of claim 1, wherein the auxiliary conductive structures are holes.

3. The circuit board of claim 2, wherein the auxiliary conductive structures are through holes.

4. The circuit board of claim 1, wherein the auxiliary conductive structures are formed by dividing a metallized through hole into a plurality of electrically independent portions, with each portion serving as one of the auxiliary conductive structures.

5. The circuit board of claim 1, wherein at least part of the first signal holes are differential signal holes.

6. The circuit board of claim 1, comprising a first sub-board and a second sub-board; and the first signal holes are communicated with all wiring layers of the first sub-board, and the auxiliary conductive structures are at least communicated with the auxiliary wiring layers and the main wiring layer located on the second sub-board.

7. The circuit board of claim 1, wherein all the signal holes in the signal hole array are the first signal holes.

8. The circuit board of claim 1, wherein part of the signal holes in the signal hole array are second signal holes, and the second signal holes are through holes.

* * * * *